(12) United States Patent
Nakamura

(10) Patent No.: US 7,632,106 B2
(45) Date of Patent: Dec. 15, 2009

(54) IC SOCKET TO BE MOUNTED ON A CIRCUIT BOARD

(75) Inventor: Yuji Nakamura, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 12/188,684

(22) Filed: Aug. 8, 2008

(65) Prior Publication Data

US 2009/0042415 A1 Feb. 12, 2009

(30) Foreign Application Priority Data

Aug. 9, 2007 (JP) ............................. 2007-207702

(51) Int. Cl.
*H01R 12/00* (2006.01)
(52) U.S. Cl. ..................... 439/66; 439/71; 439/591; 439/592
(58) Field of Classification Search ............... 439/525, 439/591, 592, 66, 71
See application file for complete search history.

(56) References Cited

U.S. PATENT DOCUMENTS

| | | | |
|---|---|---|---|
| 4,445,735 A * | 5/1984 | Bonnefoy | ............... 439/66 |
| 5,069,629 A | 12/1991 | Johnson | |
| 5,207,584 A | 5/1993 | Johnson | |
| 5,336,094 A | 8/1994 | Johnson | |
| 5,388,996 A | 2/1995 | Johnson | |
| 5,634,801 A | 6/1997 | Johnson | |
| 5,749,738 A | 5/1998 | Johnson | |
| 5,841,640 A | 11/1998 | Shibata | |
| 5,899,755 A | 5/1999 | Kline | |
| 5,913,687 A | 6/1999 | Rathburn | |
| 5,938,451 A | 8/1999 | Rathburn | |
| 5,947,749 A * | 9/1999 | Rathburn | ............... 439/66 |
| 5,967,848 A | 10/1999 | Johnson et al. | |
| 6,135,783 A | 10/2000 | Rathburn | |
| 6,178,629 B1 | 1/2001 | Rathburn | |
| 6,191,434 B1 | 2/2001 | Sakamoto | |

(Continued)

FOREIGN PATENT DOCUMENTS

EP 0718917 6/1996

(Continued)

*Primary Examiner*—Tho D Ta
(74) *Attorney, Agent, or Firm*—Banner & Witcoff, Ltd.

(57) ABSTRACT

The configuration comprises a base board to be mounted a circuit board, with an IC receiving concave place and a resilient member receiving area, having an upper wall and a lower wall surrounding the resilient member receiving area, the upper wall provided with a first slot for contact and the lower wall provided with a second slot, a contact comprising a first contact portion on which a lead of the IC is loaded, a second contact portion coming into contact with a circuit lead of the circuit board, a contact main body communicating the first contact portion with the second contact portion, and a compressing portion protruding from the rear of the contact main body, the resilient member receiving area receiving the resilient member of integral structure, set in the resilient member receiving area, in which a plurality of contacts are implanted, wherein the compressing portion compresses the resilient member in order that a contact pressure can be obtained for the contact to the IC lead and the circuit lead by means of a restoring force of the resilient member.

8 Claims, 10 Drawing Sheets

U.S. PATENT DOCUMENTS

| | | |
|---|---|---|
| 6,231,353 B1 | 5/2001 | Rathburn |
| 6,244,874 B1 * | 6/2001 | Tan ............................ 439/66 |
| 6,247,938 B1 | 6/2001 | Rathburn |
| 6,409,521 B1 | 6/2002 | Rathburn |
| 6,572,396 B1 | 6/2003 | Rathburn |
| 6,702,609 B2 | 3/2004 | Suzuki et al. |
| 6,854,981 B2 * | 2/2005 | Nelson ........................ 439/66 |
| 7,121,842 B2 | 10/2006 | Kimura |
| 7,297,003 B2 | 11/2007 | Rathburn |
| 7,303,404 B2 | 12/2007 | Osato et al. |
| 7,326,064 B2 | 2/2008 | Rathburn |
| 7,338,293 B2 * | 3/2008 | Gilk ........................... 439/66 |
| 7,422,439 B2 | 9/2008 | Rathburn |
| 7,445,465 B2 | 11/2008 | Lopez et al. |
| 2006/0183356 A1 | 8/2006 | Kimura |
| 2007/0007948 A1 | 1/2007 | Kimura et al. |
| 2007/0032128 A1 | 2/2007 | Lopez et al. |
| 2007/0069793 A1 | 3/2007 | Cranford |
| 2007/0236236 A1 | 10/2007 | Dennis et al. |
| 2008/0182436 A1 | 7/2008 | Rathburn |
| 2009/0021274 A1 | 1/2009 | Kimura |
| 2009/0053912 A1 | 2/2009 | Lopez et al. |

FOREIGN PATENT DOCUMENTS

| | | |
|---|---|---|
| EP | 0752741 | 1/1997 |
| EP | 0809328 | 11/1997 |
| EP | 1482595 | 12/2004 |
| JP | 5174880 | 7/1993 |
| JP | 7073943 | 3/1995 |
| JP | 2675710 | 11/1997 |
| JP | 2807171 | 10/1998 |
| JP | 11-031566 | 2/1999 |
| JP | 11-045768 | 2/1999 |
| JP | 11-102764 | 4/1999 |
| JP | 11-162605 | 6/1999 |
| JP | 2000046871 | 2/2000 |
| JP | 2001-035619 | 2/2001 |
| JP | 2001-135441 | 5/2001 |
| JP | 2001-235510 | 8/2001 |
| JP | 2001-237037 | 8/2001 |
| JP | 2001-257049 | 9/2001 |
| JP | 2001-305184 | 10/2001 |
| JP | 2001-319749 | 11/2001 |
| JP | 2001-326047 | 11/2001 |
| JP | 2001524256 | 11/2001 |
| JP | 2002-181881 | 6/2002 |
| JP | 2002-246128 | 8/2002 |
| JP | 2002-280137 | 9/2002 |
| JP | 2002-328149 | 11/2002 |
| JP | 2003-045593 | 2/2003 |
| JP | 2003086313 | 3/2003 |
| JP | 2003-123874 | 4/2003 |
| JP | 2003-217777 | 7/2003 |
| JP | 2003-232805 | 8/2003 |
| JP | 2003536203 | 12/2003 |
| JP | 2004061390 | 2/2004 |
| JP | 2004-247194 | 9/2004 |
| JP | 2006-216399 | 8/2006 |
| JP | 2006-351474 | 12/2006 |
| JP | 2007017444 | 1/2007 |
| JP | 3924329 | 6/2007 |
| JP | 2007535094 | 11/2007 |
| JP | 4195588 | 12/2008 |
| WO | 2005119856 | 12/2005 |
| WO | 2006006248 | 1/2006 |
| WO | 2006085388 | 8/2006 |

* cited by examiner

IC SOCKET TO BE MOUNTED ON A CIRCUIT BOARD

CROSS-REFERENCE TO RELATED APPLICATIONS

This application is based upon and claims the benefit of priority from the prior Japanese Patent Application No. 2007-207702, filed on Aug. 9, 2007; the entire contents of which are incorporated herein by reference.

FIELD OF THE INVENTION

The present invention relates to an IC socket, which acts as a contact medium between a semiconductor integrated circuit (IC) and a circuit board, and more particularly to an IC socket that can favorably correspond to improvement of the high frequency characteristic and miniaturization of components.

DESCRIPTION OF THE BACKGROUND TECHNOLOGY

Recently, the IC has a plurality of terminals formed on the side or the bottom of the main body thereof, and variety of IC sockets for lowering the inductance of the contact have been developed as the frequency of the operation signal becomes higher and higher. In order to improve the high frequency characteristics for the IC socket by means of realizing a low inductance like this, it is necessary that the length of the signal line of the socket contact should be as short as possible. On the other hand, the contact must be provided with a structure so as to compress and come in contact elastically with the lead portion of the IC. Because of the above, for example, for the contact of a type where a spring portion is prepared when the contact is punched off from a metal plate, shortening of the length of the spring i.e. shortening of the length of the signal line is restricted from the aspect of compressing-contact characteristic. Therefore, it is difficult to achieve lowering the inductance to a predetermined level by means of this type of contact.

To overcome the problem like the above, an IC socket with a structure, which has a resilient member of rubber elasticity interposed between the contact coming into contact with the lead portion of the IC and the socket cover above it, is shown in Japanese Patent No. 2849070, in order to keep the contact a standby posture and obtain a contact pressure between the contact and the IC lead by means of a restoring force of the resilient member.

However, because the number of IC leads increases as the IC becomes highly integrated or highly functionalized, it becomes hard to obtain a uniform contact pressure to the IC leads over the all contacts. Consequently, there has been a problem to ensure an appropriate compressing-contact condition between the IC lead and the socket due to occurrence of possibility of such as a partial non-contact between the contact and the IC. In view of the problem above, Japanese Patent No. 3822539 has disclosed an IC socket that assures an appropriate characteristic of the IC upon realizing a uniform contact pressure to the IC over the all contacts.

Nowadays, semiconductor devices constituting the IC (Integrated Circuit) are progressing in miniaturization of semiconductor elements, so that speeding-up of operation thereof and narrowing of the pitch of the lead terminals are going forward. To this end, packaging technology that does not damage the performance of electrical property of semiconductor devices such as high frequency characteristics, or characteristic estimation technology is increasingly being important. Because of the above, densification of IC packaging, and miniaturization and narrowing of the pitch of the lead pattern in a circuit board have been progressing. Besides, further downsizing of the IC socket that is a contact medium between the IC and the circuit board and lowering of the impedance including lowering of the inductance have been strongly required. Here, the IC socket is used for packaging of the IC to the circuit board, or for electrical test, burn-in test, etc. of the IC.

The present invention is carried out in view of the circumstances mentioned above and intended to provide an IC socket, which realizes a novel contact making easier lowering the height of the IC socket for downsizing and lowering the impedance than ever before and corresponds favorably to improvement of the high frequency characteristics and miniaturization of the IC.

SUMMARY OF THE INVENTION

To achieve the above mentioned purpose, the IC socket to be mounted on a circuit board according to the present invention has a structure which comprises a base board having an upper wall and a lower wall face to face with each other to surround together a resilient member receiving area, the base board being mounted on a circuit board, the upper wall located at the side of an IC with leads loaded attachably, the lower wall located at the side of the circuit board, and at least the upper wall of the upper wall and the lower wall forming a plurality of slots aligned corresponding to each lead of the IC, a plurality of contacts comprising a contact main body, a first contact portion formed on one end thereof and the lead of the IC coming in contact with the end, a second contact portion formed on another end thereof and extending in one direction and coming in contact with a circuit lead of the circuit board, and a compressing portion provided protrusively on an opposite side to the extending direction of the second contact portion of the contact main body, and a resilient member located in the resilient member receiving area and holding elastically and aligning the contact, the first contact portion of the contact being inserted in the slot of the upper wall and exposed from a surface of the upper wall, and the compressing portion of the contact coming in contact elastically with the resilient member and keeping the contact a standby posture, and compressing the resilient member when the first contact portion comes in contact with and is compressed by the lead of the IC, and obtaining a contact pressure between the first contact portion and the lead of the IC and a contact pressure between the second contact portion and the circuit lead of the circuit board.

The IC socket to be mounted on a circuit board according to the present invention also has a structure wherein the base board contains an upper base board to load an IC thereon and a lower base board located on the circuit board and forming a resilient member receiving area upon being superposed with the upper base board, the upper base board having an upper wall partitioning the resilient member receiving area, the upper wall forming a first slot, the lower base board having a lower wall partitioning the resilient member receiving area, the lower wall forming a second slot, the resilient member holding elastically and aligning the contact, the first contact portion of the contact being inserted in the first slot and exposed from a surface of the upper wall, the second contact portion of the contact coming in contact with the circuit lead through the second slot.

As the contact can be easily down-sized and minimized in accordance with the invention mentioned above, the IC socket can be decreased in height and further minimized. Furthermore, electrical connection between the IC lead and the circuit lead becomes firm, so that the impedance of the IC socket can stably be lowered as well as the minimization of the above-mentioned contact. In addition, in spite of the number of leads is increased due to narrowing of the pitch of the IC leads, variation of the contact pressure over the all contacts is small in compressing contact to the IC leads, so that appropriate IC characteristics can easily be obtained.

Because the pivoting center of the contact and the first contact portion are close together compared with the conventional technology, excess forward falling caused by the conventional technology is suppressed, so that contacting of the contacts to each other is prevented. The contacts can be located closely at the corner portion of the QON (Quad Outline Non lead) structure. Transcription of solder of the IC lead caused by repeated use can also be suppressed to the minimum, so that stable connection can be maintained for a long period. Additionally, the first contact portion can compress and come into contact with the GND lead formed on the center of the rear surface of the package because the first contact portion protrudes from the upper surface of the base board or the top base board mentioned above.

In the invention mentioned above, a structure can be realized in which the resilient member comprises two resilient bodies in the shape of a string or a column and the compressing portion of each contact compresses one of the two resilient bodies and further the first contact portion and the second contact portion are connected to another of the two resilient bodies. In this case, the rubber elastic constant of the former resilient body is preferably smaller than the rubber elastic constant of the latter resilient body.

In addition, in the above-mentioned invention, a structure in which the resilient member comprises one resilient body in the shape of a string or a column and the compressing portion of each contact compresses the one resilient body described above, and a curved surface formed integral with the base board, the upper base board or the bottom base board protruding from the receiving area being sidably fit to the contact main body can also be available.

In the preferred embodiment of the invention mentioned above, the resilient member is an integral structure with rubber elasticity and a plurality of through-holes passing through the resilient member vertically in plural arrangements and at least the contact main body of the contact is inserted into the through-hole, and the first contact portion and the second contact portion are connected with the upper portion and the lower portion of the resilient member respectively.

A counterbored portion to which the second contact portion is fitted is formed on the bottom surface of the resilient member. Preferably a notch portion is formed on the upper portion of the through-hole in order that the resilient member can be pushed up to the notch portion when the compressing portion compresses the resilient member.

In the preferred embodiments mentioned above, because the contact is implanted in the resilient member of integral structure, assembling process of the IC socket having the contact mentioned above is simplified. As a result, productivity thereof can be improved and cost reduction thereof can be easily performed.

The present invention can provide an IC socket corresponding to improvement of the high frequency characteristics and downsizing of the IC by realizing a novel contact easily capable of lowering the height of the IC socket and downsizing and lowering the impedance than ever before. It can easily correspond to speeding-up of the IC and narrowing the pitch of leads thereof, and can perform packaging or estimation of the characteristics of the semiconductor device without diminishing high quality characteristic thereof.

BRIEF DESCRIPTION OF THE DRAWINGS

FIG. 8a is a cross sectional view of the standby condition when the IC socket is mounted on the circuit board and FIG. 8b is a cross sectional view of the firmly mounted state when the IC is loaded on the IC socket.

DETAILED DESCRIPTION OF THE INVENTION

Figure 1:
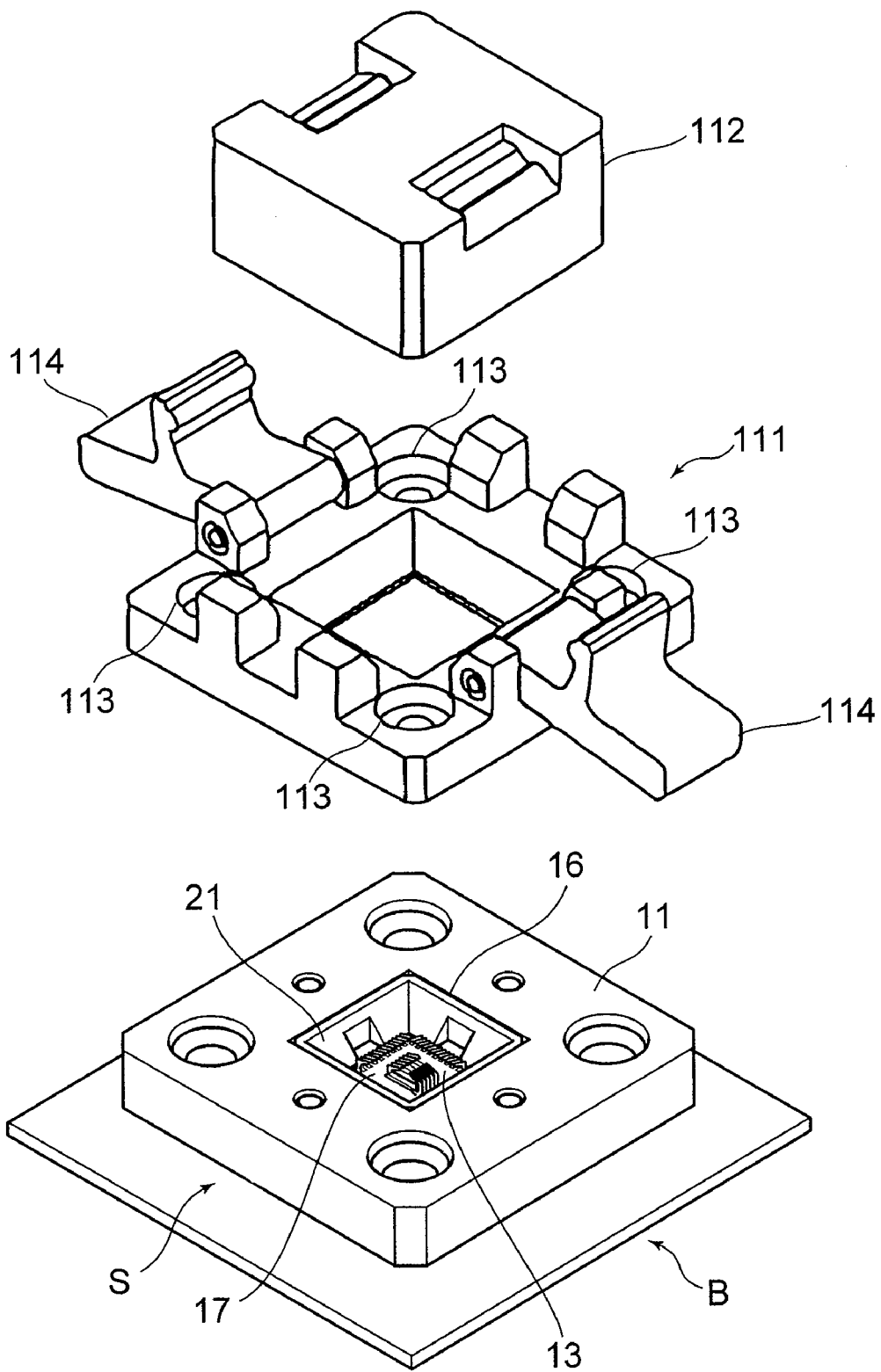
FIG. 1 is an entire perspective view showing an example of the IC socket according to the first embodiment of the present invention when it is mounted on a circuit board.

Hereinafter, embodiments of the present invention will be explained in detail by the aid of drawings. However, the invention is not limited the embodiments described below, but many variations can be utilized.

Some embodiments of the present invention will be explained hereafter referring to the drawings. In the drawings, the same or similar parts to each other are denoted by a common mark and duplicated explanation will be partly omitted.

The First Embodiment

Figure 2:
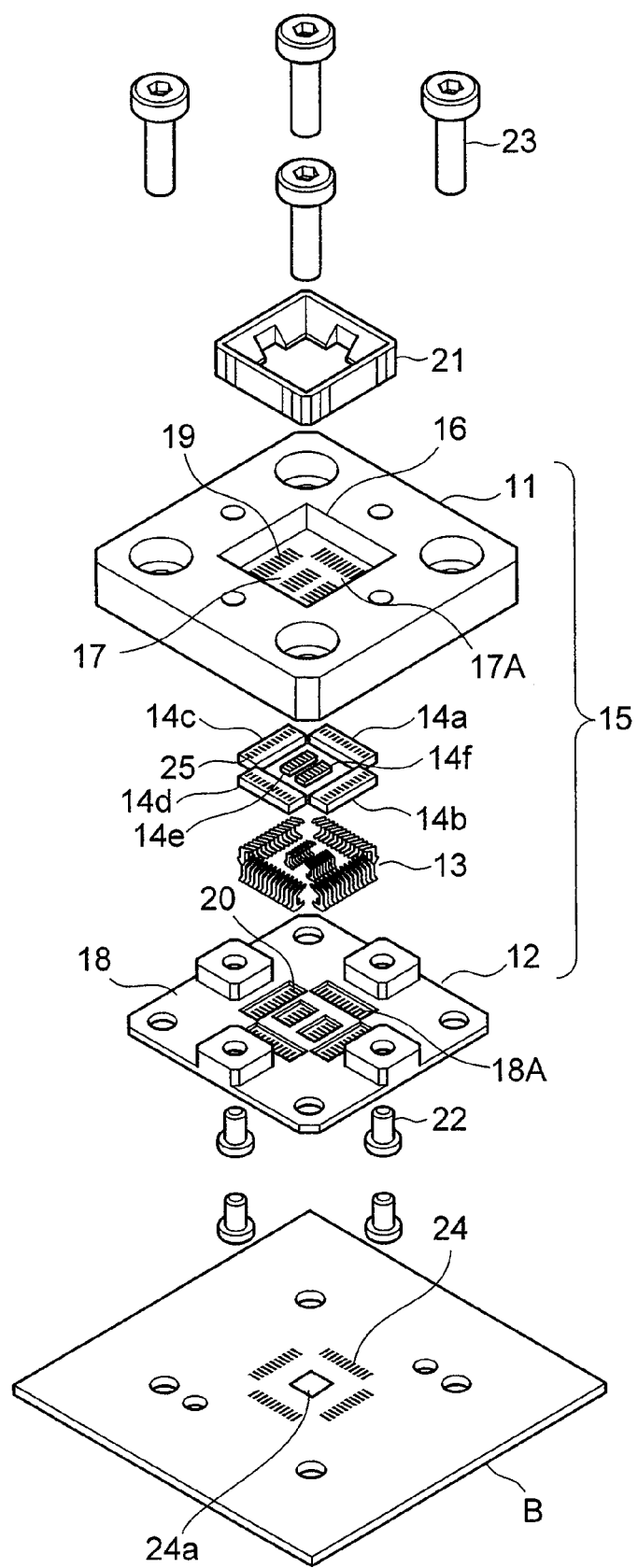
FIG. 2 is an exploded perspective view showing the substantial part of the IC socket and the circuit board according to the first embodiment of the present invention.

The IC socket relating to the first embodiment of the present invention will be explained by referring to FIG. 1 to FIG. 8. FIG. 1 is a perspective view showing an example of an IC socket and an IC presser lid mounted on a circuit board such as a test board. FIG. 2 is an exploded perspective view showing the substantial part of the IC socket and the circuit board of the above-mentioned example.

As shown in FIG. 1 and FIG. 2, the IC socket S is provided with a first assembly 11 of approximately square and a second assembly 12 superimposed on the first assembly 11. These assemblies are formed by molding an insulative synthetic resin having excellent workability. Between the first assembly 11 and the second assembly 12, an insulative resilient member 14 of rubber-elasticity having a plurality of contacts 13 implanted therein is to be inserted. Though the details will be described later, the contact 13 is a rigid structure of metallic material and the resilient member 14 is e.g. an integral structure of such as silicone rubber. A plurality of through-holes are formed in the resilient member 14, and each contact 13 is to be coupled with and inserted in each through-hole. The first assembly 11, the second assembly 12, the contact 13 and the resilient member 14 constitute a socket body 15 together as a substantial part.

Here, a concave place, which forms an IC receiving place 16, is provided at the central part of the first assembly 11, and e.g. six resilient members 14 (14a, 14b, 14c, 14d, 14e and 14f) are attached along e.g. four sides facing together or on approximately the center of the IC receiving place 16. Moreover, a plurality of contacts 13 are implanted and placed through the through-holes of each resilient member 14. Though details will be described later, a top base board 17 forming the bottom surface of the IC receiving place 16 in the first assembly 11 and a bottom base board 18 in the second assembly 12 will hold tight together six of the above-mentioned resilient members 14.

In the top base board 17 and the bottom base board 18, a plurality of first slots 19 for contact and a plurality of second slots 20 for contact are opened and arranged respectively, and the through-hole 25 of the resilient member 14 corresponds to the slot 19, 20. The upper ends of the contacts 13 implanted in the through-hole 25 of the resilient member 14 extend to the upper side of the surface of the top base board 17, and the bottom ends of the contacts 13 extend to the lower side of the rear surface of the bottom base board 18.

Then, a square frame-like socket guide 21 is to be fitted into the IC receiving place 16. The socket guide 21 is to facilitate an IC to be guided and mounted into the IC receiving place 16. As shown in FIG. 1, in the case of a configuration where an IC presser lid member having a presser lid base 111 and a presser lid 112 is attached to the IC socket S, the IC is fixed in the IC receiving concave place 16 manually by the presser lid member. When an IC is attachably mounted by a handler device, the IC presser lid member is not used, but the socket guide 21 guides the IC into the IC receiving concave place 16 to load and fix it. Like the above, the IC socket S is constituted of the socket main body 15, the socket guide 21, or the IC presser lid member, etc.

The first assembly 11 and the second assembly 12 are fixed together with clipping the resilient member 14 having the contact 13 implanted therein by a first screw 22, and form the socket main body 15. The bottom end of the contact 13 of the IC socket S comes into contact with and is fixed to e.g. a circuit lead 24 or a GND lead 24a on the surface of the circuit board B of the test board by the second screw 23, as described later. When the IC presser lid member is attached to the IC socket S, the second screw 23 is secured through a screw hole 113 of the presser lid base 111. Thus, the presser lid 112 is tightly engaged with the presser lid base 111 by a stopper portion 114.

Figure 3:
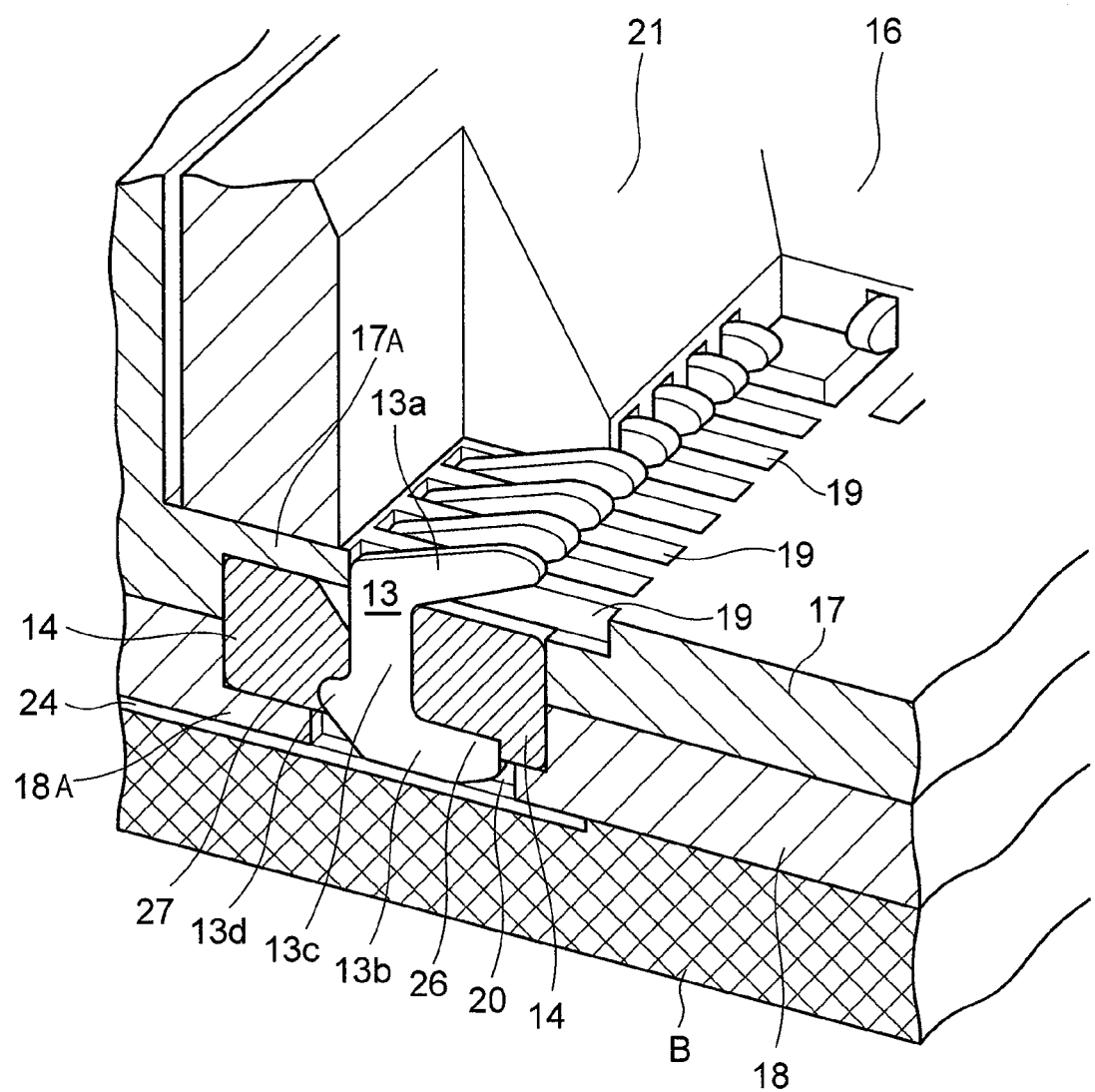
FIG. 3 is a magnified perspective view of the substantial part showing partly the disposition of the contact and the resilient member of the IC socket according to the first embodiment of the present invention.
Figure 4:
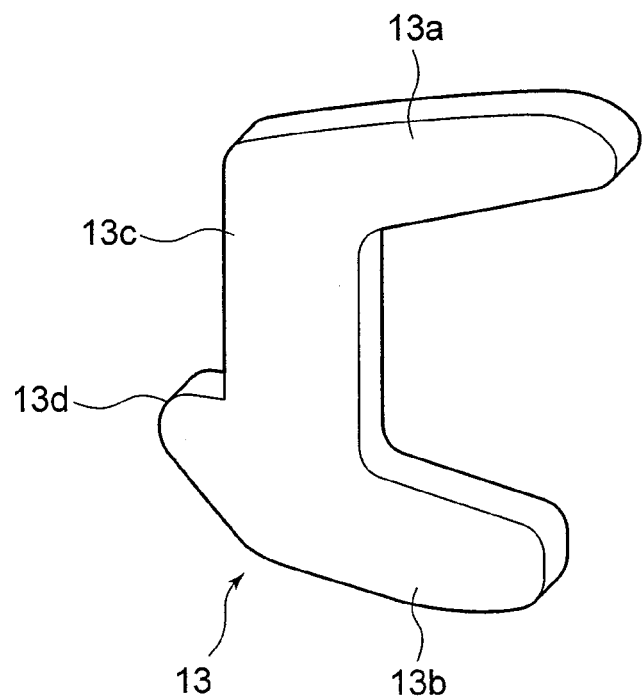
FIG. 4 is a perspective view showing a contact of the IC socket according to the first embodiment of the present invention.
Figure 5:
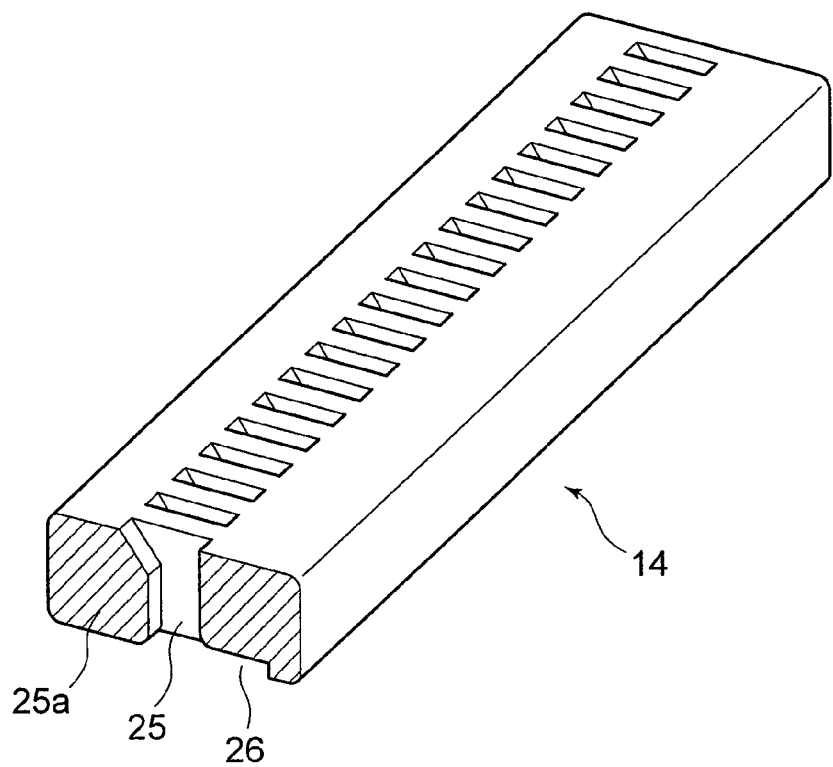
FIG. 5 is a perspective view showing a resilient member of the IC socket according to the first embodiment of the present invention.
Figure 6:
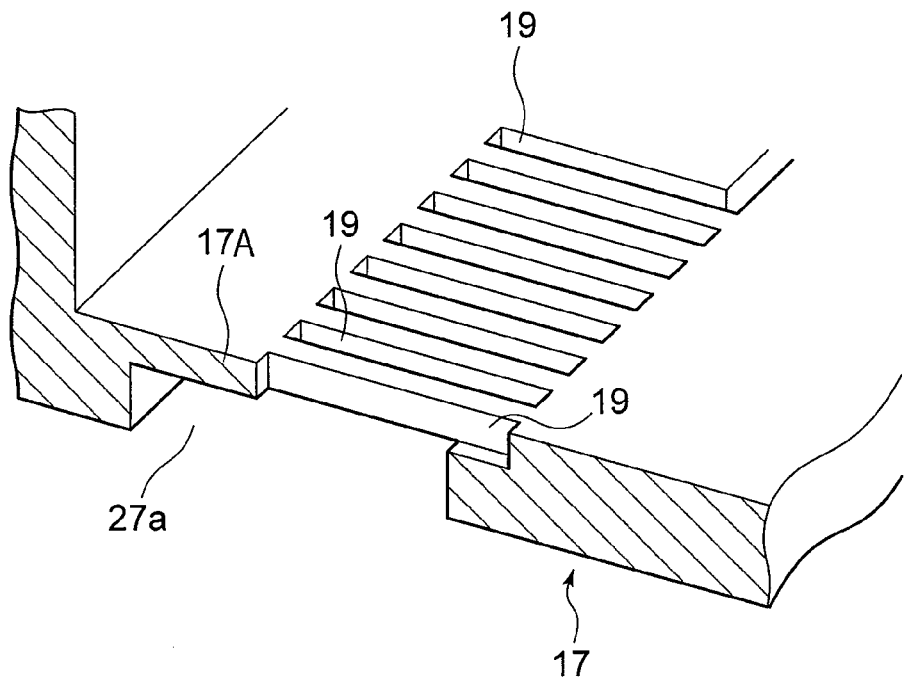
FIG. 6 is a perspective view in partial magnification showing the top base board of the socket main body in the first embodiment of the present invention.
Figure 7:
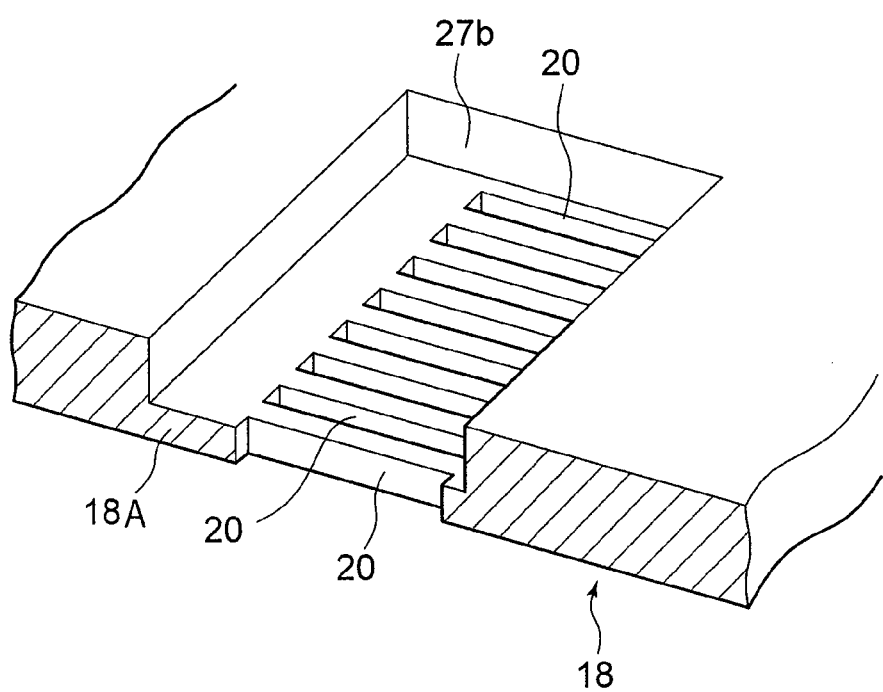
FIG. 7 is a perspective view in partial magnification showing the bottom base board of the socket main body in the first embodiment of the present invention.

The characteristic substantial part of the present invention will be further described in more detail. FIG. 3 is a magnified perspective view of the substantial part showing partly the disposition of the contact 13 and the resilient member 14 of the IC socket in accordance with the first embodiment. Here, the IC socket S is in the standby condition where an IC is not loaded. FIG. 4 is a perspective view showing one contact 13, and FIG. 5 is a perspective view showing the resilient member 14. FIG. 6 and FIG. 7 are perspective views showing in partial magnification the top base board 17 that holds tight the resilient member 14 having the contact 13 implanted therein from upside and the bottom base board 18 that holds tight the same resilient member 14 from downside respectively.

As shown in FIG. 3 and FIG. 4, the contact 13 comprises a first contact portion 13a extending in an obliquely transversal direction toward the IC receiving concave place 16, a second contact portion 13b extending in an approximately transverse direction, a contact main body 13c connecting the first contact portion 13a with the second contact portion 13b in the vertical direction, and a compressing portion 13d protruding in the reversely transversal direction from a predetermined position of the contact main body 13c. Such contact 13 is fabricated by punching out integrally a rigid conductive board in an approximately horseshoe shape. Then, the IC lead is put on the upper end surface of the first contact portion 13a. A circuit lead 24 of the circuit board B comes into contact with the bottom end surface of the second contact portion 13b.

As shown in FIG. 3 and FIG. 5, the contact 13 inserted in a through-hole 25 opening vertically in the resilient member 14 is embedded in the through-hole 25 at the contact main body 13c thereof. The first contact portion 13a and the second contact portion 13b compress the resilient member 14 of e.g. rubber capable of three-dimensionally resilient deformation. The resilient member 14 is fabricated by, for example, injection molding of elastomer constituting a rubber elastic body, and a counterbored portion 26 is formed over the longitudinal direction of the bottom surface of the resilient member 14. The second contact portion 13b of each contact 13 is fitted into the counterbored portion 26. In consequence, all contacts 13 are engaged with the resilient member 14. Thus, the contact 13 is implanted in each one of the required number of through-holes 25 formed in the integral structure-type resilient member 14.

As shown in FIG. 3, FIG. 6 and FIG. 7, the resilient member 14 in which a plurality of contacts 13 are implanted is fitted into the resilient member receiving area 27 provided at a predetermined position of the top base board 17 of the first assembly 11 and the bottom base board 18 of the second assembly 12.

As shown in FIG. 6, the upper wall 17A, where a plurality of first slots 19 for contact surrounding the groove-like first resilient member receiving concave area 27a and communicating therewith are bored, is formed in the top base board 17. In the same way, as shown in FIG. 7, the lower wall 18A, where a plurality of second slots 20 for contact surrounding the groove-like second resilient member receiving concave area 27b and communicating therewith are bored, is formed in the bottom base board 18. On the occasion when the first assembly 11 and the second assembly 12 are superposed together, the resilient member 14 can be assembled by embedding it into the resilient member receiving area 27 upon e.g. receiving it in the second resilient member receiving concave area 27b and then closing the first resilient member receiving concave area 27a from upside thereof. Like the above, the resilient member receiving area 27 is constituted of the first resilient member receiving area 27a and the second resilient member receiving area 27b.

In respect of attaching the resilient member 14 to the resilient member receiving concave area 27, the first contact portion 13a of each contact 13 extends upward from the first slot 19 for contact corresponding thereto, and these contacts 13 are isolated from each other by the material of the top base board 17 between the first slots 19 for contact as an insulating partition wall. In the same way, the second contact portion 13b of each contact 13 protrudes downward a little from the second slot 20 for contact, and these contacts 13 are isolated from each other by the material of the bottom base board 18 between the second slots 20 for contact as an insulating partition wall.

As shown in FIG. 3, the socket guide 21 to be fitted into the IC receiving concave place 16 of the first assembly 11 has a configuration in which the first contact portion 13a extending from the first slot 19 for contact is covered by a groove provided in the bottom thereof except for a part on which the IC lead is loaded.

On the occasion when the IC socket S is attached to the circuit board B, the resilient member 14 compresses elastically the second contact portion 13b downward, and the bottom surface of the second contact portion 13b of the contact 13 compresses and comes into contact with the circuit lead 24. The first contact portion 13a is also elastically compressed upward by the resilient member 14. At the same time, the compressing portion 13d of the contact 13 gets an elastic compression downward by the resilient member 14. Then the compressing portion 13d gives an anticlockwise pivoting to the horseshoe-shaped contact 13 due to compression by the resilient member 14. Here, the anticlockwise pivoting of the contact 13 is restricted by the upper side end surface of the contact main body 13c of the contact 13 coming into contact with the inner surface of the first slot 19 for contact of the top base board 17.

As mentioned above, the resilient member 14 keeps the contact 13 the standby condition, i.e. the standby posture before the IC lead is loaded on the upper end surface of the first contact portion 13a of the contact 13, in such a manner that the IC socket S is mounted on the circuit board B.

On the other hand, when an IC is guided by the oblique surface of the socket guide 21 and then loaded on the IC socket S, the IC lead comes into contact with the upper end surface of the first contact portion 13a exposed from the groove portion of the socket guide 21 and gives a compression force to it. This compression force gives an anticlockwise pivoting to the horseshoe-shaped contact 13, and the compressing portion 13d of the contact 13 receives a stronger restoring force from the resilient member 14. In consequence, the contact 13 of the IC socket S is put in the firmly loaded condition where the IC is loaded thereon.

When the IC is removed from the IC socket and the compressing force mentioned above is released, the contact 13 returns to the standby condition by the above-mentioned strong restoring force from the resilient member 14. For the clockwise or anticlockwise pivoting of the contact 13, a predetermined position on the lower end surface of the second contact portion 13b of the contact 13 becomes the point of support.

Figure 8A:
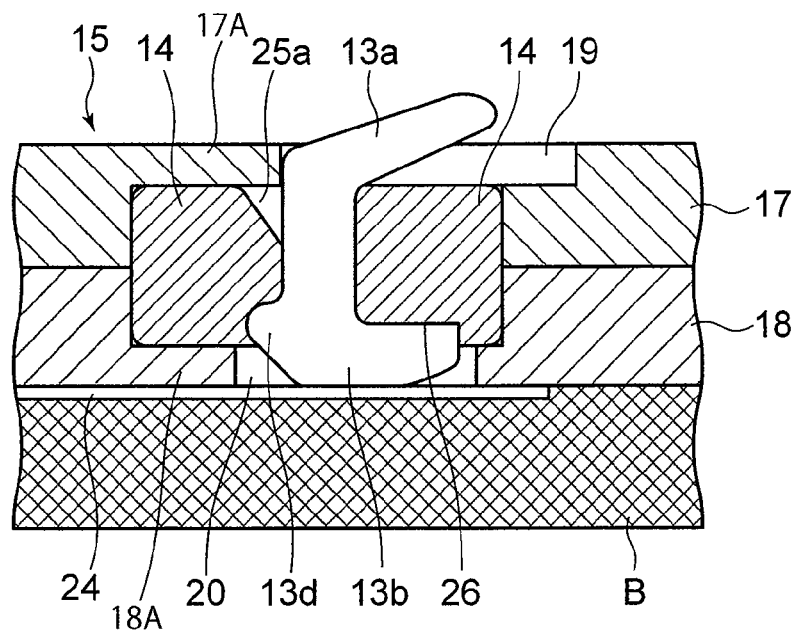
FIG. 8a and FIG. 8b are explanatory diagrams provided for explanation of movement of the contact and the resilient member of the IC socket, where
Figure 8B:
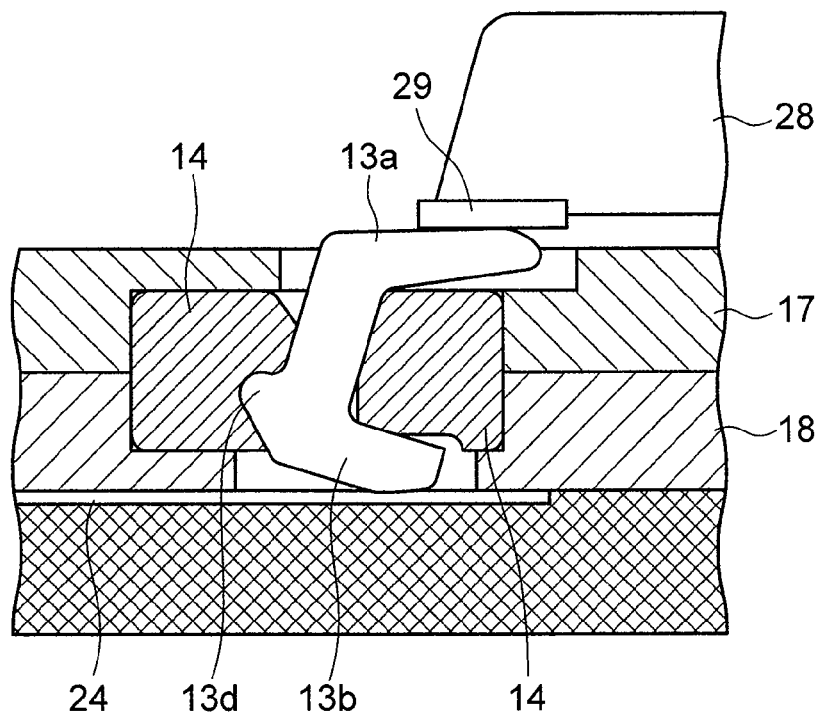

In the next place, movement of the contact 13 and the resilient member 14 will be explained in accordance with FIG. 8a and FIG. 8b so as to clarify more the configuration thereof FIG. 8a and FIG. 8b are explanatory diagrams provided for explanation of movement of the contact and the resilient member of the IC socket, where FIG. 8a is a cross sectional view of the standby condition when the IC socket is mounted on the circuit board and FIG. 8b is a cross sectional view on the firmly loaded condition when the IC is loaded on the IC socket. The socket guide is omitted for simplification.

As shown in FIG. 8a, the IC socket S mentioned above is mounted on the circuit board B and the socket main body 15 is put on the circuit lead 24.

Thereby, the second contact portion 13b of the contact 13 compresses primarily the resilient member 14 from the counterbored portion 26 at the bottom surface thereof. Then, the compressing portion 13d compresses primarily the lower portion of the through-hole 25 in such a manner as to push up a part of the resilient member 14 around the through-hole 25 toward the notch portion 25a. As the counteraction of these primary compressions, a push-down force is applied to the second contact portion 13b and the compressing portion 13d. The bottom end surface of the second contact portion 13b compresses the circuit lead 24 and comes into contact therewith by the push-down force of the second contact portion 13b. Furthermore, the push-down force of the compressing portion 13d generates a counterclockwise pivoting of the contact 13 on a supporting point at a predetermined position on the bottom end surface of the second contact portion 13b. The first contact portion 13a extends as far as the inside of the IC receiving concave place 16, so that the standby posture for IC becomes more assured.

In order to keep superposition of the socket main body 15 and the circuit lead 24, the first assembly 11 and the second assembly 12 are clamped together by the first screw 22 as shown in e.g. FIG. 1 and FIG. 2 in such a manner as to clip the resilient member 14 that has the contact 13 implanted therein. The IC socket S is secured to the circuit board B with the second screw 23.

Figure 9:
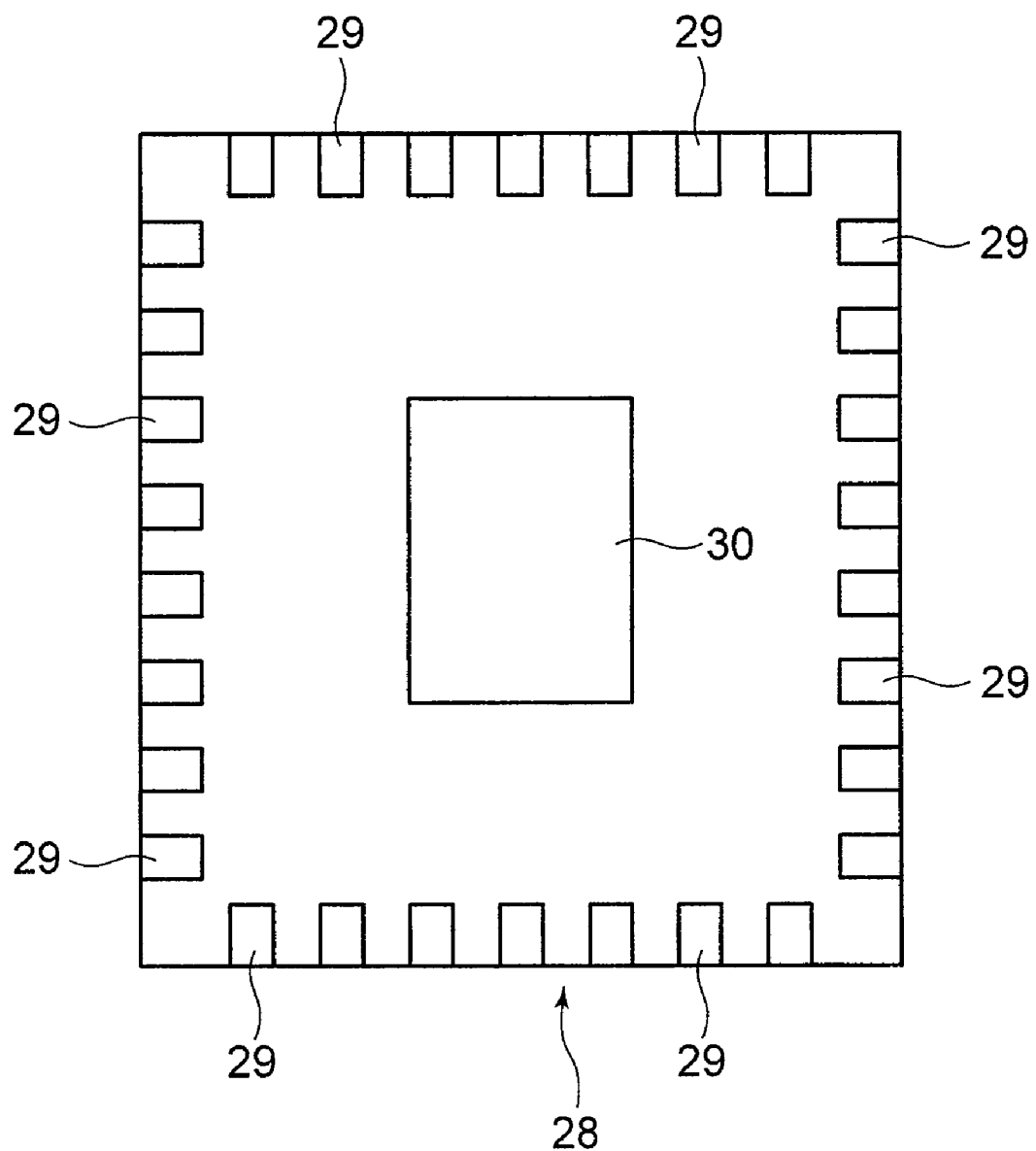
FIG. 9 is a plan view from the reverse side showing an example of the IC in the embodiment of the present invention.

As shown in FIG. 8b, the IC 28 is firmly loaded on the IC receiving concave place 16 through the socket guide 23 in such a manner that the IC lead 29 is put on and comes into contact with the top end surface of the first contact portion 13a of the contact 13. Here, the IC 28 is, for example, an integrated circuit semiconductor device that seals a high speed operating semiconductor device as shown in FIG. 9. The package thereof has a QON structure in which the IC leads 29 are arranged on the four sides of the rear surface thereof at a narrow pitch and the GND lead 30 is formed on approximately the central portion of the rear surface.

Because of loading and contacting of the IC lead 29, the first contact portion 13a is pivoted downward on a predetermined position of the bottom end surface of the second contact portion 13b as the supporting point. As a result, the compressing portion 13d compresses secondarily the resilient member 14 on the primarily compressed condition. In addition, a part of the secondarily compressed resilient member 14 is pushed up to the notch portion 25a. Then, the top end surface of the first contact portion 13a compresses and comes into contact with the IC lead as a counteraction thereof. Additionally, the bottom end surface of the second contact portion 13b compresses and comes into contact with the circuit lead 24 of the circuit board B. Thereby, the shortest length of the signal line is formed by the contact 13 connecting electrically the IC lead 29 with the circuit lead 24, which extends from the first contact portion 13a to the second contact portion 13b through the contact main body 13c.

The GND lead 30 located at approximately the center of the rear surface of the IC 28 is electrically connected with the GND lead 24a corresponding thereto of the circuit board B through the contact 13 like the one explained in FIG. 8a and FIG. 8b. If the area of the GND lead 30 is increased as shown in FIG. 9 in order to lower the impedance thereof, electrical connection can be carried out by means of a plurality of contacts 13 as shown in FIG. 2.

Figure 10:
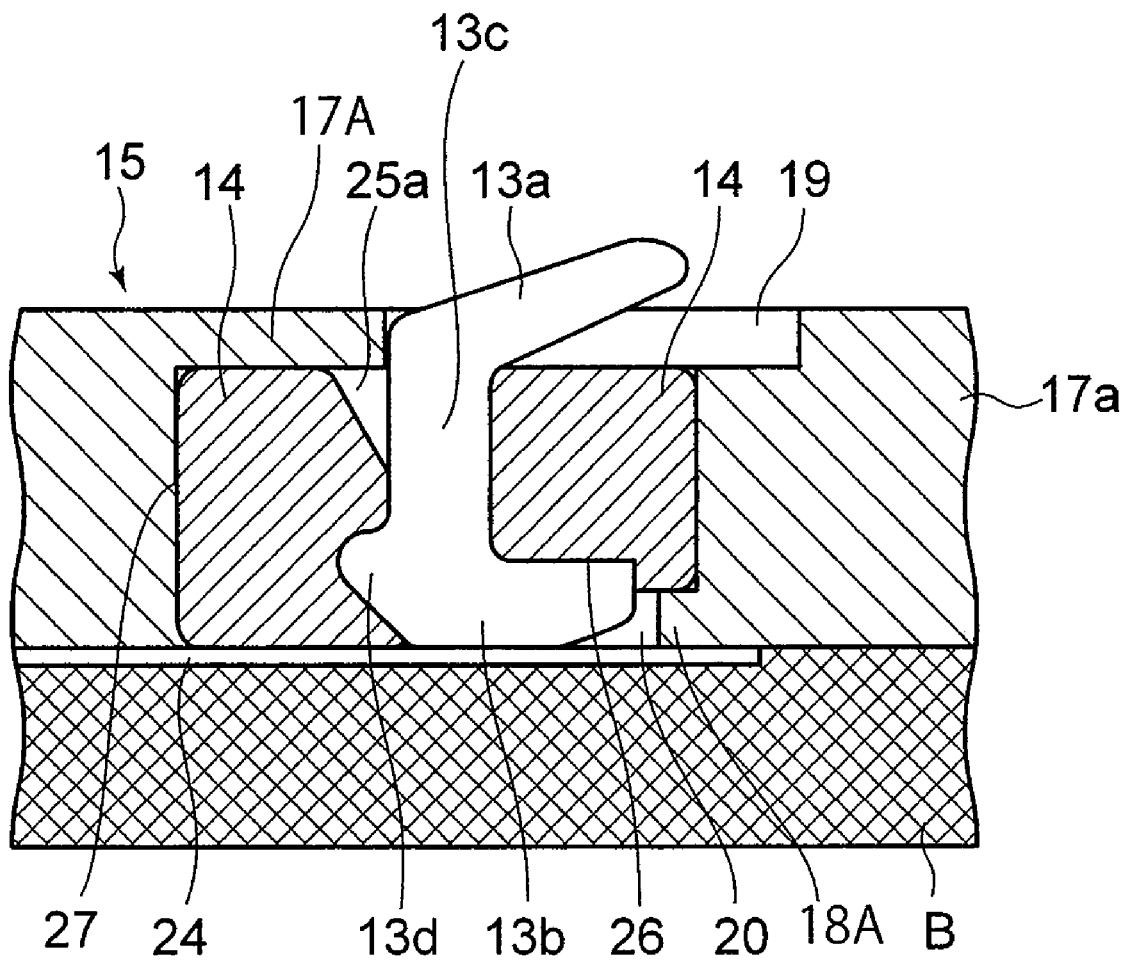
FIG. 10 is a partially magnified cross sectional view showing an IC socket as a version of the first embodiment of the present invention when it is mounted on a circuit board.

Another version of the embodiment mentioned above will be explained in the next place referring to FIG. 10. FIG. 10 is a partially magnified cross sectional view showing an IC socket as a version when it is mounted on a circuit board. However, the socket guide 21 is omitted because of simplification.

As shown in FIG. 10, in this case, a plate top base board 17*a* thicker than the top base board 17 of the above-mentioned embodiment is used and the resilient member receiving area 27 is formed at a predetermined place of the top base board 17*a*. On the top surface and the bottom surface of the top base board 17*a*, a plurality of the first slots 19 for contact and the second slots 20 for contact are arranged respectively in communication with the resilient member receiving area 27. The resilient member receiving area 27 is formed open to the bottom surface side of the top base board 17*a* at a predetermined place thereof.

The resilient member 14 that has a plurality of contacts 13 implanted therein is embedded into the resilient member receiving area 27 provided in the top base board 17*a*. The first contact portion 13*a* of each contact 13 extends upward from the first slot 19 for contact corresponding thereto, and these contacts 13 are separated from each other by the material 17*a* of the top base board between the first slots 19 for contact as an insulating partition wall. The second contact portion 13*b* of each contact 13 is able to extend downward from the second slot 20 for contact.

All second slots 20 for contact can also have a structure which is formed integrally with the resilient member receiving area 27 without being separated by the material 17*a* of the top base board as an insulating partition wall. In the configuration like this, the resilient member 14 can be easily inserted into the resilient member receiving area 27 from the bottom surface side of the top base board 17*a*.

Though the cross section of the resilient member 14 is a little different from that of the embodiment mentioned above as shown in FIG. 10, the fundamental structure and function thereof are the same. For example, the through-hole 25 having the notch portion 25*a* is provided in the resilient member 14 and moreover the counterbored portion 26 is formed therein. The contact main body 13*c* of each contact 13 is tightly inserted into the through-hole 25 of the resilient member 14, and the second contact portion 13*b* is fitted into the counterbored portion 26. The compressing portion 13*d* of each contact 13 is set to receive an elastic compression by the resilient member 14. As mentioned above, a plurality of contacts 13 are implanted in the resilient member 14.

In the case of the socket main body 15 of this version, the standby condition and the firmly loaded posture for IC loading of the contact 13 are the same as those that have been explained in the above-mentioned embodiment, so that these explanations will be omitted.

In this embodiment, the contact 13 used for the IC socket has a simplified integral structure of e.g. horseshoe-shape that contains the first contact portion 13*a* extending in an obliquely transversal direction, the second contact portion 13*b* extending in an approximately transversal direction, the contact main body 13*c* connecting the first contact portion 13*a* with the second contact portion 13*b* in the vertical direction and the compressing portion 13*d* protruding in a reverse transversal direction at a predetermined point of the contact main body 13*c* as mentioned above. A plurality of the contacts 13 are inserted and implanted by the part thereof into the through-holes 25 provided in the integral structure type resilient member 14. Thanks to the configuration above, miniaturization of the contact is facilitated and the IC socket can be so decreased in height that miniaturization thereof can be further pushed forward. Because the contact is implanted in the integral structure type resilient member, assembling operation of the IC socket having the above-mentioned contact is simplified and then productivity thereof can be improved.

In the firmly loaded posture in which the IC is loaded on the IC socket or in the standby condition in which the IC is removed from the IC socket, an elastic mutual interaction acts effectively between the compressing portion 13*d* provided at a predetermined position of the contact and the resilient member 14. Furthermore, this elastic mutual interaction gives a pivoting to the contact. The first contact portion 13*a* compresses and comes into contact with the IC lead at the upper side of the contact, or the second contact portion 13*b* compresses and comes into contact with the circuit lead of the circuit board at the lower side of the contact.

Because excess forward falling is suppressed and thereby contacting between contacts is prevented, the IC leads can be closely positioned at the corner portion of the QON structure. Furthermore, electrical connection between the IC lead and the circuit lead becomes firm, so that the impedance of the IC socket can be lowered stably as well as miniaturizing the contact mentioned above.

Even though the number of the leads is increased because the pitch of the IC leads becomes narrow, deviation of contact pressures over all contacts is small for compressing and coming into contact with the IC lead. Thus, the appropriate IC characteristics can be easily obtained.

As mentioned above, the IC socket of this embodiment can correspond to speeding up the IC and narrowing the pitch of leads thereof without difficulty, so that packaging or characteristic estimation can be carried out without impairing high performance characteristics of the semiconductor device.

As shown in FIG. 1 and FIG. 2, the structure in which the resilient members 14*e* and 14*f* are mounted at about the center of the IC receiving concave place 16 and are connected with the GND lead 24*a* through the contact 13 implanted in those resilient members is explained in the embodiment mentioned above. Here, the GND lead 24*a* is the same as the circuit lead 24, and these contacts 13 may be connected with the circuit lead so as to become the signal line respectively. In addition, a structure in which four resilient members 14*a*, 14*b*, 14*c* and 14*f* except for the resilient members 14*e* and 14*f* are arranged along e.g. the four sides facing together of the IC receiving concave place 16 is also possible.

The Second Embodiment

Figure 11:
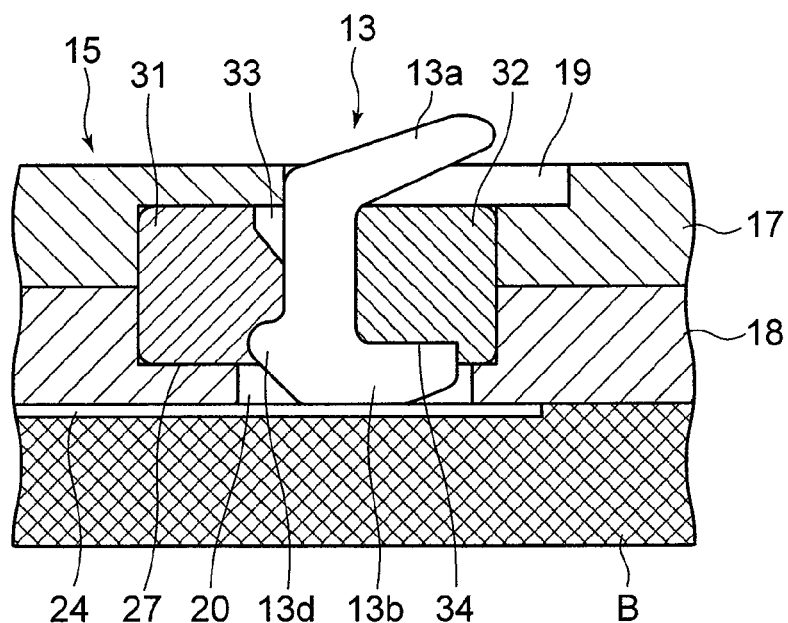
FIG. 11 is a partially magnified cross sectional view showing an example of the IC socket according to the second embodiment of the present invention when it is mounted on a circuit board.
Figure 12:
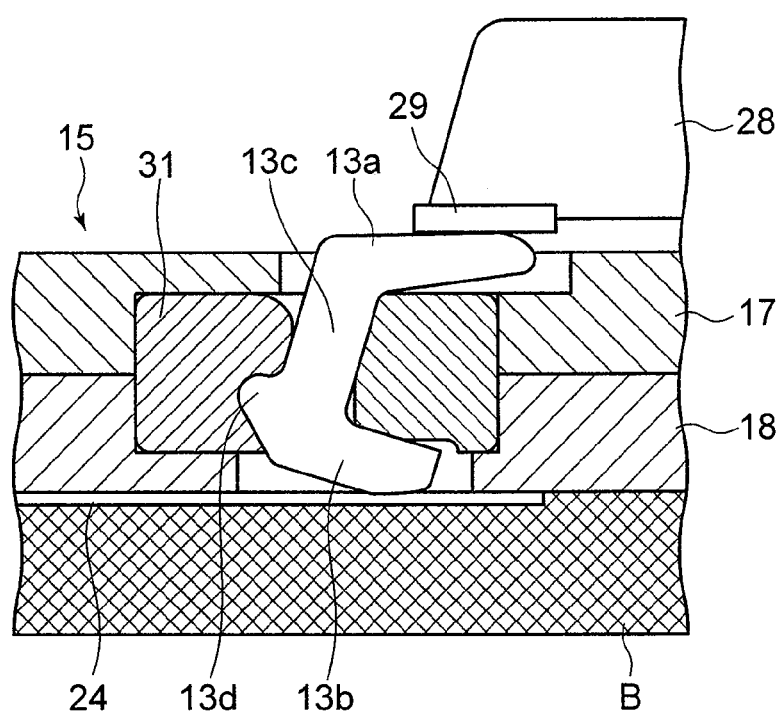
FIG. 12 is a partially magnified cross sectional view of the IC socket according to the second embodiment of the present invention when an IC is loaded thereon.

An IC socket according to the second embodiment of the present invention will be explained referring to FIG. 11 and FIG. 12. An aspect of the IC socket of this embodiment is that each contact is implanted with both sides thereof pinched by two resilient members in the shape of a string or a column extending in the direction of the raw of contacts instead of the resilient member 14 of integral structure explained in the first embodiment. FIG. 11 is a partially magnified cross sectional view showing an example of the IC socket when it is mounted on a circuit board, and FIG. 12 is a partially magnified cross sectional view of the IC socket when an IC is loaded thereon. However, the socket guide 21 is omitted because of simplification.

As shown in FIG. 11, a first resilient member 31 and a second resilient member 32 are mounted in such a manner as to fit in the resilient member receiving area 27 provided in predetermined positions of the top base board 17 of the first assembly 11 and the bottom base board 18 of the second assembly 12, just as explained in the first embodiment. Here, the first resilient member 31 and the second resilient member 32 are made of e.g. elastomers in the shape of a string having rubber elastic properties different from each other, and hold tight together a plurality of contacts 13 from both sides thereof extending from the front of the paper of FIG. 11 to the rear thereof in the resilient member receiving area 27.

The notch portion 33 is prepared by cutting off one corner of the first resilient member 31, and the counterbored portion 34 is formed on the bottom surface of the second resilient member 32. Then, the second contact portion 13b of each contact 13 is fitted in the counterbored portion 34. Like the above, a plurality of contacts 13 are pinched by the first resilient member 31 and the second resilient member 32 so as to be implanted therein.

As explained in the first embodiment, the contact portion 13a of each contact 13 extends upward from the first slot 19 for contact corresponding thereto, and these contacts 13 are separated from each other by the material 17 of the top base board between the first slots 19 for contact as an insulating partition wall. In the same way, the second contact portion 13b of each contact 13 protrudes downward a little from the second slot 20 for contact, and these contacts 13 are separated from each other by the material 18 of the bottom base board between the second slots 20 for contact as an insulating partition wall.

On the occasion when the IC socket main body 15 is attached to the circuit board B, the second resilient member 32 compresses elastically the second contact portion 13b downward, and the bottom surface of the second contact portion 13b of the contact 13 compresses and comes into contact with the circuit lead 24. The first contact portion 13a is elastically compressed upward by the second resilient member 32. At the same time, the compressing portion 13d of the contact 13 gets an elastic compression downward by the first resilient member 31. The compressing portion 13d gives an anticlockwise pivoting to the horseshoe-shaped contact 13 due to compression by the first resilient member 31. Here, the anticlockwise pivoting of the contact 13 is restricted by the upper side end surface of the contact main body 13c of the contact 13 coming into contact with the inner surface of first slot 19 for contact of the top base board 17.

In consequence, the first resilient member 31 and the second resilient member 32 keep the contact 13 the standby condition by means of mounting the above-mentioned IC socket on the circuit board B.

On the other hand, when the IC 28 is loaded on the IC socket, the IC lead 29 is put on and comes into contact with the top end surface of the first contact portion 13a, and gives a compression force thereto. This compression force makes the horseshoe-shaped contact 13 pivot clockwise, and the compressing portion 13d of the contact 13 receives a stronger restoring force from the first resilient member 31.

Here, a part of the first resilient member 31 is pushed up to the notch portion 33. The top end surface of the first contact portion 13a compresses and comes into contact with the IC lead 29 by this strong restoring force. Similarly, the bottom end surface of the second contact portion 13b compresses and comes into contact with the circuit lead 24 of the circuit board B. Thus, the contact 13 is in the firmly mounted condition where the IC lead 29 is loaded thereon to come into contact therewith. The shortest length of the signal line is formed by the contact 13, which connects electrically the IC lead 29 with the circuit lead 24 and extends from the first contact portion 13a to the second contact portion 13b through the contact main body 13c.

When the IC is removed from the IC socket and the above-mentioned compressing force is released, the contact 13 is restored in the standby condition mentioned above by means of the strong restoring force from the aforementioned first resilient member 31.

In this embodiment, assembling work of the IC socket becomes a little tangled compared to the case of using an integral structure type resilient member explained in the first embodiment because a plurality of contacts 13 are assembled in such a structure that pinches the contacts 13 from both sides thereof with two resilient members. However, the second embodiment can also perform approximately the same effect as that explained in the first embodiment.

Moreover, rubber-like elastic materials different from each other can be arbitrarily selected for the first resilient member 31 and the second resilient member 32. The restoring force, which the contact 13 receives from these resilient members, and the clockwise or anticlockwise pivoting are able to be arbitrarily regulated, if the first resilient member 31 and the second resilient member 32 have different rubber elasticity from each other. For example, when the rubber elastic constant of the second resilient member 32 is set to be smaller than that of the first resilient member 31 in order to enlarge deformation thereof, horizontal shift against the surface of the circuit lead 24 is added to the contact 13 during the clockwise or anticlockwise pivoting of the contact 13.

The horizontal shift of the contact 13 decreases degree of rubbing the second contact portion 13b on the surface of the circuit lead 24 during the clockwise or anticlockwise pivoting thereof. As a result, abrasion on the surface of the circuit lead by the rubbing mentioned above, which occurs at mounting of the IC socket on the circuit board or loading of the IC on the IC socket, can be reduced drastically.

In addition, because compression stress of the resilient member due to pivoting or horizontal shift of the contact is dispersed widely by locating the resilient member on both sides of the contact 13, repetition durability of the resilient member is improved. Additionally, long period reliability of the IC socket can be improved.

As was explained by the version of the first embodiment, a configuration in which the resilient member receiving area 27 is formed on the top base board 17a in the assembly 11 and the first resilient member 31, the second resilient member 32 and a plurality of contacts 13 are mounted in this resilient member receiving area 27 may also be available in the second embodiment.

The Third Embodiment

Figure 13:
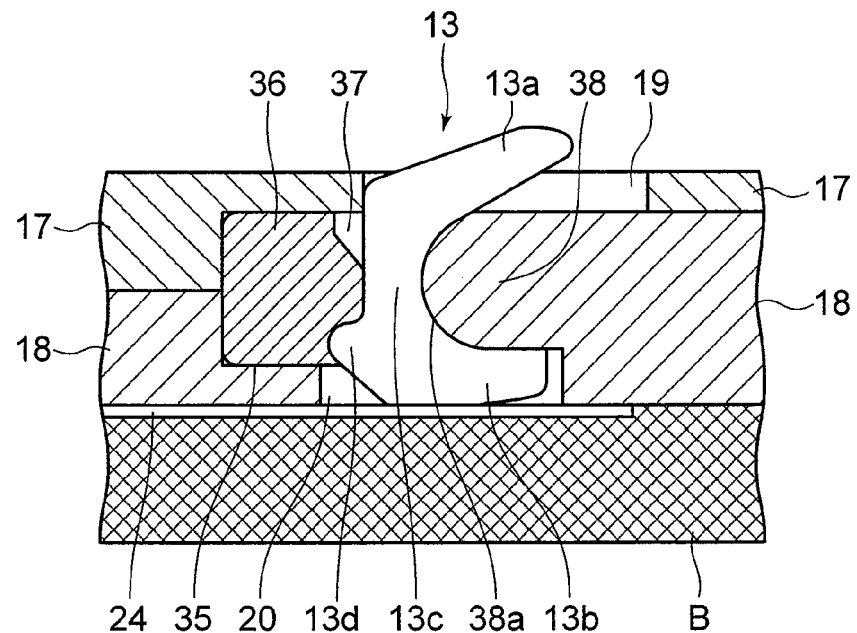
FIG. 13 is a partially magnified cross sectional view showing one example of the IC socket according to the third embodiment of the present invention when it is mounted on a circuit board.
Figure 14:
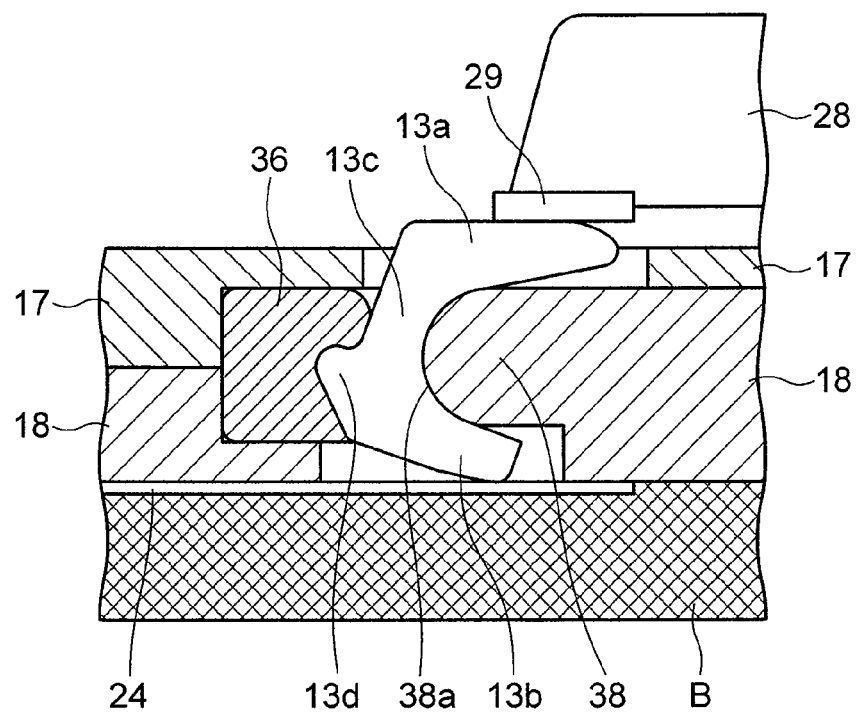
FIG. 14 is a partially magnified cross sectional view of the state where an IC is loaded on the IC socket according to the third embodiment of the present invention.

An IC socket according to the third embodiment of the present invention will be explained referring to FIG. 13 and FIG. 14. An aspect of the IC socket of this embodiment is that each contact is implanted with both sides thereof pinched by a resilient member in the shape of a string or a column and a jutted synthetic resin extending in the direction of the raw of contacts instead of the integral structure type resilient member 14 explained in the first embodiment. FIG. 13 is a partially magnified cross sectional view showing one example of the IC socket when it is mounted on a circuit board, and FIG. 14 is a partially magnified cross sectional view of a state in which an IC is loaded on the IC socket. However, the socket guide 21 is omitted because of simplification.

As shown in FIG. 13, a resilient member 36 in the shape of a string is fitted into the resilient member receiving area 35 provided at predetermined places of the top base board 17 of the first assembly 11 and the bottom base board 18 of the second assembly 12 as is the case explained in the first embodiment. Here, the resilient member 36 in the shape of a string is an elastomer having rubber elasticity. A plurality of contacts 13 are held tight from both sides thereof by means of the resilient member 36 in the shape of a string extending from the front of the paper of FIG. 13 to the rear thereof and a sidably fitting portion 38 having a curved surface 38*a* provided integrally with the bottom base board 18 and protruding toward the resilient member receiving area 35.

The notch portion 37 is prepared by cutting off one corner of the resilient member 36 in the shape of a string, and the contact main body 13*c* of each contact 13 is sidably fitted into the curved surface 38*a*. Like the above, a plurality of contacts 13 are pinched by the resilient member 36 in the shape of a string and the sidably fitting portion 38 so as to be implanted.

The contact portion 13*a* of each contact 13 extends upward from the first slot 19 for contact corresponding thereto, and these contacts 13 are separated from each other by the material 17 of the top base board between the first slots 19 for contact as the insulating partition wall. In the same way, the second contact portion 13*b* of each contact 13 protrudes downward a little from the second slot 20 for contact, and these contacts 13 are separated from each other by the material 18 of the bottom base board between the second slots 20 for contact as the insulating partition wall. Here, all the first slots 19 for contact and the second slots 20 for contact are communicated together with the resilient member receiving area 35.

When the IC socket main body 15 is attached to the circuit board B, the bottom surface of the second contact portion 13*b* of the contact 13 compresses and comes into contact with the circuit lead 24. At the same time, the resilient member 36 in the shape of a string compresses elastically downward the compressing portion 13*d* of the contact 13, the second contact portion 13*b* compresses and comes into contact with the circuit lead 24. In addition, the compressing portion 13*d* gives an anticlockwise pivoting to the horseshoe-shaped contact 13 due to compression by the resilient member 36 in the shape of a string. Here, the contact 13 is pivoted because the contact main body 13*c* thereof is sidably fitted to the curved surface of the sidably fitting portion 38. As is the case of the first embodiment, the anticlockwise pivoting of the contact 13 is restricted because the upper side end surface of the contact main body 13*c* of the contact 13 comes into contact with the inner surface of first slot 19 for contact of the top base board 17.

In consequence, the resilient member 36 in the shape of a string and the sidably fitting portion 38 keep the contact 13 the standby condition upon mounting the above-mentioned IC socket on the circuit board B.

On the other hand, when the IC 28 is loaded on the IC socket, the IC lead 29 is put on and comes into contact with the top end surface of the first contact portion 13*a*, and gives a compression force thereto. This compression force makes the horseshoe-shaped contact 13 pivot clockwise. Here, the contact 13 is pivoted because the contact main body 13*c* thereof is sidably fitted to the curved surface of the sidably fitting portion 38.

The compressing portion 13*d* of the contact 13 receives a stronger restoring force from the resilient member 36 in the shape of a string. At this time, a part of the resilient member 36 in the shape of a string is pushed up the notch portion 37. The top end surface of the first contact portion 13*a* compresses and comes into contact with the IC lead 29 by the strong restoring force. Similarly, the bottom end surface of the second contact portion 13*b* compresses and comes into contact with the circuit lead 24 of the circuit board B. The shortest length of the signal line is formed, as is the case of the first embodiment, by the contact 13, which extends from the first contact portion 13*a* to the second contact portion 13*b* through the contact main body 13*c* to connect electrically the IC lead 29 with the circuit lead 24.

When the IC is removed from the IC socket and the above-mentioned compressing force is released, the contact 13 is restored in the standby condition mentioned above by means of the strong restoring force from the resilient member 36 in the shape of a string mentioned above.

As mentioned above, the contact 13 is pivoted because the contact main body 13*c* thereof is sidably fitted to the curved surface of the sidably fitting portion 38. In order to smooth the sliding on the curved surface of the contact main body 13*c*, it is preferable that the bottom base board 18 and the sidably fitting portion 38 should be formed of synthetic resin such as polyimide resin. In addition, the sidably fitting portion 38 may have the structure formed integrally with the top base board 17.

According to this embodiment, the effect as explained in the first embodiment can be performed. The structure of the resilient member 36 in the shape of a string is simpler than that of the integral structure resilient member 14, so that assembling work of the IC socket becomes more convenient.

As was explained by the version of the first embodiment, a configuration in which the resilient member receiving area 35 having the sidably fitting portion 38 is formed on the top base board 17*a* in the first assembly 11 and the resilient member 36 in the shape of a string and a plurality of contacts 13 are mounted in this resilient member receiving area 35, may also be available in the third embodiment.

Although some preferable embodiments of the present invention have been explained heretofore, the embodiments mentioned above do not restrict the range of the present invention. Those skilled in the art can add various kinds of modification or change without any departure from the technological idea and the technological range of the present invention for specific embodiments.

In regard to formation of the resilient member receiving area 27 explained in the version of the embodiment mentioned above, a structure in which it is provided like the top base board 17*a* on the bottom base board 18 of the second assembly 12 instead of the top base board 17 of the first assembly 11 can also be available.

Though the resilient member explained in the above-mentioned embodiment is a rubber-like resilient member, any other types can be available if they have rubber elasticity. For example, an air tube or a liquid tube can be employed as the resilient member. In these cases, a synthetic resin tube or a rubber tube is made a hollow structure in which air or liquid is sealed off.

The shape of the cross section of the resilient member can also be a non-hollow structure of a polygon, an ellipse or a circle as well as a rectangle.

In addition, the IC socket having the contact and the resilient member mentioned above can be used as a contact medium between electronic components as well as the IC and the circuit board without changing the fundamental configuration thereof.

What is claimed is:

1. An IC socket to be mounted on a circuit board, comprising a base board having an upper wall and a lower wall face to face with each other to surround together a resilient member receiving area and having a curved surface formed integral with the base board and protruding to the resilient member receiving area, the base board being mounted on a circuit board, the upper wall located at the side of an IC with leads loaded attachably, the lower wall located at the side of the circuit board, and at least the upper wall of the upper wall and the lower wall farming a plurality of slots aligned corresponding to each lead of the IC, a plurality of contacts comprising a contact main body, a first contact portion formed on one end thereof and the lead of the IC coming in contact with the end, a second contact portion formed on another end thereof and extending in one direction and coming in contact with a circuit lead of the circuit board, and a compressing portion provided protrusively on an opposite side to the extending direction of the second contact portion of the contact main body, and a resilient member comprising one resilient body in the shape of a string or a column located in the resilient member receiving area and holding elastically and aligning the contact, the first contact portion of the contact being inserted in the slot of the upper wall and exposed from a surface of the upper wall, and wherein the curved surface is sidably fit to the contact main body, and the compressing portion of each contact compresses the one resilient body in contact elastically with the resilient member keeping the contact a standby posture and compresses the resilient member when the first contact portion comes in contact with and is compressed by the lead of the IC, and obtaining a contact pressure between the first contact portion and the lead of the IC and a contact pressure between the second contact portion and the circuit lead of the circuit board.

2. The IC socket as set forth in claim 1, wherein the base board contains an upper base board to load an IC thereon and a lower base board located on the circuit board and forming a resilient member receiving area upon being superposed with the upper base board, the upper base board having an upper wall partitioning the resilient member receiving area, the upper wall forming a first slot, the lower base board having a lower wall partitioning the resilient member receiving area, the lower wall forming a second slot, the resilient member holding elastically and aligning the contact, the first contact portion of the contact being inserted in the first slot and exposed from a surface of the upper wall, the second contact portion of the contact coming in contact with the circuit lead of the circuit board through the second slot.

3. The IC socket as set forth in claim 1, wherein the contact is a plate body in a shape of a horseshoe.

4. An IC socket to be mounted on a circuit board, comprising a base board having an upper wall and a lower wall face to face with each other to surround together a resilient member receiving area, the base board being mounted on a circuit board, the upper wall located at the side of an IC with leads loaded attachably, the lower wall located at the side of the circuit board, and at least the upper wall of the upper wall and the lower wall forming a plurality of slots aligned corresponding to each lead of the IC, a plurality of contacts comprising a contact main body, a first contact portion formed on one end thereof and the lead of the IC coming in contact with the end, a second contact portion formed on another end thereof and extending in one direction and coming in contact with a circuit lead of the circuit board, and a compressing portion provided protrusively on an opposite side to the extending direction of the second contact portion of the contact main body, and a resilient member located in the resilient member receiving area and holding elastically and aligning the contact, the first contact portion of the contact being inserted in the slot of the upper wall and exposed from a surface of the upper wall, and the compressing portion of contact coming in contact elastically with the resilient member keeping the contact a standby posture, and compressing the resilient member when the first contact portion comes in contact with and is compressed by the lead of the IC, and obtaining a contact pressure between the first contact portion and the lead of the IC and a contact pressure between the second contact portion and the circuit lead of the circuit board, wherein the resilient member is an integral structure with rubber elasticity and a plurality of through-holes passing through the resilient member vertically in plural arrangements and at least the connecting portion of the contact is inserted into the through-hole, and the first contact portion and the second contact portion being connected with an upper portion and a lower portion of the resilient member respectively, and wherein a notch portion is formed on the upper portion of the through-hole for the resilient member to be pushed up to the notch portion when the resilient member is compressed by the compressing portion.

5. The IC socket as set forth in claim 4, wherein the base board contains an upper base board to load an IC thereon and a lower base board located on the circuit board and forming a resilient member receiving area upon being superposed with the upper base board, the upper base board having an upper wall partitioning the resilient member receiving area, the upper wall forming a first slot, the lower base board having a lower wall partitioning the resilient member receiving area, the lower wall forming a second slot, the resilient member holding elastically and aligning the contact, the first contact portion of the contact being inserted in the first slot and exposed from a surface of the upper wall, the second contact portion of the contact coming in contact with the circuit lead of the circuit board through the second slot.

6. The IC socket as set forth in claim 4, wherein a counterbored portion fitting the second contact portion is formed on the bottom surface of the resilient member.

7. The IC socket as set forth in claim 4, wherein the contact is a plate body in a shape of a horseshoe.

8. The IC socket as set forth in claim 4, wherein the through-hole corresponds to the slot.

* * * * *